United States Patent [19]

Nishida et al.

[11] 3,998,748

[45] * Dec. 21, 1976

[54] PIEZOELECTRIC CERAMIC COMPOSITIONS

[75] Inventors: Masamitsu Nishida, Osaka; Hiromu Ouchi, Toyonaka, both of Japan

[73] Assignee: Matsushita Electric Industrial Co., Ltd., Tokyo, Japan

[ * ] Notice: The portion of the term of this patent subsequent to Aug. 20, 1991, has been disclaimed.

[22] Filed: July 16, 1975

[21] Appl. No.: 596,563

[30] Foreign Application Priority Data

July 18, 1974 Japan .............................. 49-82826
July 18, 1974 Japan .............................. 49-82827
Aug. 16, 1974 Japan .............................. 49-94541

[52] U.S. Cl. .................................................. 252/62.9
[51] Int. Cl.² .................. C04B 35/46; C04B 35/48
[58] Field of Search ................................. 252/62.9

[56] References Cited

UNITED STATES PATENTS

| | | |
|---|---|---|
| 3,372,121 | 3/1968 | Banno ................................ 252/62.9 |
| 3,536,625 | 10/1970 | Murakawa et al. ................ 252/62.9 |
| 3,830,742 | 8/1974 | Nishida et al. .................... 252/62.9 |

FOREIGN PATENTS OR APPLICATIONS

| | | |
|---|---|---|
| 4,613,899 | 4/1971 | Japan .............................. 252/62.9 |
| 1,354,657 | 5/1974 | United Kingdom | |

*Primary Examiner*—Jack Cooper
*Attorney, Agent, or Firm*—Wenderoth, Lind & Ponack

[57] ABSTRACT

Piezoelectric ceramic compositions having very high mechanical quality factors, high electromechanical coupling coefficients and high mechanical strength, and comprising the quaternary system $Pb(Zn_{1/3}Nb_{2/3})O_3$-$Pb(Sn_{1/3}Nb_{2/3})O_3$-$PbTiO_3$-$PbZrO_3$ and containing 0.05 to 5 weight % of $MnO_2$, and further containing at least one oxide selected from the group consisting of $Nb_2O_5$ in 0.3 to 3 weight %, $WO_3$ in 0.1 to 2 weight % and $Sb_2O_3$ in 0.1 to 3 weight % are provided.

2 Claims, No Drawings

PIEZOELECTRIC CERAMIC COMPOSITIONS

This invention relates to piezoelectric ceramic compositions and articles of manufacture fabricated therefrom. More particularly, this invention pertains to novel and improved ferroelectric ceramics which are polycrystalline aggregates of certain constituents. These piezoelectric compositions are sintered into ceramics by ordinary ceramic techniques and thereafter the ceramics are polarized by applying a D.C. voltage between electrodes to impart thereto electromechanical transducing properties similar to the well known piezoelectric effect. This invention also encompasses the calcined intermediate products of raw ingredients and the articles of manufacture such as electromechanical transducers fabricated from the sintered ceramic.

The use of piezoelectric materials in various transducer applications in, for example, the production, measurement and sensing of sound, shock, vibration, pressure, and high voltage generation, has increased greatly in recent years. Both crystal and ceramic types of transducers have been widely used, but because of their potentially lower cost and ease of use in the fabrication of ceramics of various shapes and sizes and their greater durability at high temperature and/or high humidities than crystalline substances such as Rochelle salt, piezoelectric ceramic materials have recently come into prominent use in various transducer applications.

The piezoelectric characteristics required for ceramics apparently vary depending upon the intended application. For example, electromechanical transducers such as phonograph pick-ups and microphone elements require piezoelectric ceramics characterized by a substantially high electromechanical coupling coefficient and dielectric constant. On the other hand, in the ultrasonic transducer and piezoelectric transformer applications of piezoelectric ceramic compositions, it is desirable that the materials exhibit a higher value of mechanical quality factor, a high electromechanical coupling coefficient and high mechanical strength.

As a promising ceramic for these applications, lead titanate-lead zirconate has been in wide use up to now. However, it is difficult to get a very high mechanical quality factor and a high planar coupling coefficient along with high tensile strength in the conventional lead titanate-lead zirconate ceramics. Moreover, the dielectric and piezoelectric properties of the lead titanate-lead zirconate ceramics vary greatly depending upon the firing technique employed due to the evaporation of PbO. Improvement of these factors has been made by incorporating various additional constituents into the basic ceramic composition or by incorporating various complex compounds. For example, U.S. Pat. No. 2,911,370 teaches lead titanate zirconate ceramics modified with $Nb_2O_5$, $Ta_2O_5$, $Y_2O_3$, etc., and U.S. Pat. No. 3,830,742 teaches quaternary system $Pb(Zn_{1/3}Nb_{2/3})O_3$-$Pb(Sn_{1/3}Nb_{2/3})O_3$-$PbTiO_3$-$PbZrO_3$ ceramics. And British Pat. No. 1,354,657 teaches quaternary system $Pb(Zn_{1/3}Nb_{2/3})O_3$-$Pb(Sn_{1/3}Nb_{2/3})O_3$-$PbTiO_3$-$PbZrO_3$ ceramics modified with $MnO_2$ additive. These ceramics exhibit a high electromechanical coupling coefficient, but exhibit a relatively low mechanical strength.

It is, therefore, a fundamental object of this invention to provide novel and improved piezoelectric ceramic materials which overcome the problems outlined above.

A specific object of this invention is the provision of improved polycrystalline ceramics characterized by very high mechanical quality factors and high planar coupling coefficents along with high tensile strengths.

These objects are achieved by providing ceramic bodies which exist basically in the solid solution comprising the quaternary system $Pb(Zn_{1/3}Nb_{2/3})O_3$-$Pb(Sn_{1/3}Nb_{2/3})O_3$-$PbTiO_3$-$PbZrO_3$ modified with $MnO_2$ and at least one oxide selected from $Nb_2O_5$, $WO_3$ and $Sb_2O_3$.

This invention is based on the discovery that within certain particular compositional ranges of this system, the specimens exhibit very high mechanical quality factors and high electromechanical coupling coefficients along with high mechanical strength.

The ceramic compositions of this invention have various advantages in the processes for their manufacture and in their application for ceramic transducers. It has been known that the evaporation of PbO during firing is a problem encountered in the sintering of lead compounds such as lead titanate-zirconate. The compositions of this invention evidence a smaller amount of evaporated PbO than the usual lead titanate-zirconate upon firing. The quaternary system can be fired in the absence of a PbO atmosphere. A well sintered body according to this composition is obtained by firing the above described compositions in a ceramic crucible covered with a ceramic cover made of $Al_2O_3$ ceramics. A high sintered density is desirable for resistance to humidity and high piezoelectric response when the sintered body is utilized as a resonator and for other applications.

Some compositions coming with the quaternary system $Pb(Zn_{1/3}Nb_{2/3})O_3$-$Pb(Sn_{1/3}Nb_{2/3})O_3PbTiO_3$-$PbZrO_3$ do not exhibit a high piezoelectricity, and many are electromechanically active only to a slight degree. The basic compositions of this invention concern those represented by the formula $Pb(Zn_{1/3}Nb_{2/3})_A(Sn_{1/3}Nb_{2/3})_B Ti_C Zr_D O_3$, wherein the ranges for A, B, C and D are $0 < A \leq 0.50$, $0 < B \leq 0.25$, $0.25 \leq C \leq 0.625$ and $0.20 \leq D \leq 0.625$, and wherein $A+B+C+D=1$, and exhibiting piezoelectric response of appreciable magnitude. The basic compositions are preferably represented by the formula $Pb(Zn_{1/3}Nb_{2/3})_A(Sn_{1/3}Nb_{2/3})_B Ti_C Zr_D O_3$, wherein $0.01 \leq A \leq 0.50$, $0.01 \leq B \leq 0.25$, $0.25 \leq C \leq 0.625$ and $0.20 \leq D \leq 0.625$, and wherein $A+B+C+D=1$, and they exhibit relatively high piezoelectricity. The compositions of this invention comprise the basic compositions of the above description and additives of $MnO_2$, and at least one oxide selected from $Nb_2O_5$, $WO_3$ and $Sb_2O_3$.

The compositions described herein may be prepared in accordance with various well-known ceramic procedures. A preferred method, however, hereinafter more fully described, contemplates the use of PbO or $Pb_3O_4$, ZnO, $SnO_2$, $Nb_2O_5$, $TiO_2$, $ZrO_2$, $MnO_2$ and $WO_3$ or $Sb_2O_3$ as starting materials.

EXAMPLE 1

The starting materials, viz, lead oxide (PbO), zinc oxide (ZnO), stannic oxide ($SnO_2$), niobia ($Nb_2O_5$), titania ($TiO_2$), zirconia ($ZrO_2$), manganese dioxide ($MnO_2$), tungsten trioxide ($WO_3$), antimony trioxide ($Sb_2O_3$), all of relatively pure grade (e.g., c.p. grade), are intimately mixed in a rubber-lined ball mill with distilled water. In milling the mixture, care was exercised to avoid contamination due to wear of the milling ball or stones and this was avoided by varying the proportions of the starting materials to compensate for any contamination.

Following the wet milling, the mixture was dried and mixed to ensure as homogeneous a mixture as possible. Thereafter, the mixture was suitably formed into desired forms at a pressure of 400 kg/cm$^2$. The compacts were then pre-reacted by a calcination at a temperature of about 850° C for about 2 hours. After this calcination, the reacted material was allowed to cool and was then wet milled to a small particle size. $MnO_2$ and $Nb_2O_5$, $WO_3$ or $Sb_2O_3$ may be added to the reacted material after calcination of raw materials which did not include $MnO_2$. Once again, care was exercised to avoid contamination by wear of the milling balls or stones. Depending on preference and the shapes desired, the material may be formed into a mix or slip suitable for pressing, slip casting, or extruding, as the case may be, in accordance with conventional ceramic forming procedures. The mix was then pressed into discs of 20 mm diameter and 2 mm thickness at a pressure of 700 kg/cm$^2$. The pressed discs were fired at 1250° to 1310° C for 45 minutes. There was no need to fire the composition in an atmosphere of PbO, and moreover, there was no need to maintain a special temperature gradient in the firing furnace as is necessary in the procedures used to form known piezoelectric compositions. Uniform and excellent ceramic products were easily obtained simply by covering the samples with an alumina crucible during firing.

The sintered ceramics were polished on both surfaces to a thickness of 1 millimeter. The polished disc surfaces were then coated with silver paint and fired to form silver electrodes. Finally, the discs were polarized while immersed in a bath of silicone oil at 100° C. A voltage gradient of D.C. 3 to 4 kV per mm was maintained for 1 hour, and the disc was field-cooled to room temperature in 30 minutes.

The piezoelectric and dielectric properties of the polarized specimens were measured at 20° C in a relative humidity of 50 %. The tensile strengths of the specimens were measured by using the ceramic having I shape (cross section of about 7 mm × 3 mm). Examples of specific ceramic compositions according to this invention and various properties thereof are given in Table 1.

From Table 1, it will be evident that according to this invention, all exemplary compositions modified with $MnO_2$ and $Nb_2O_5$, $WO_3$ or $Sb_2O_3$ are characterized by very high mechanical quality factors and high planar coupling coefficients along with high tensile strengths, all of which properties are important for the use of piezoelectric compositions in piezoelectric transformers and ultra-sonic transducer applications. Therefore, the piezoelectric ceramic compositions of this invention are suitable for the application of electromechanical transducer elements such as piezoelectric transformers and ultra-sonic transducers. The compositions of this invention other than the above exemplary compositions exhibit also excellent piezoelectric and mechanical properties.

In ceramic compositions containing the $MnO_2$ additive in an amount greater than 5 weight %, $Q_M$ and $K_P$ of the ceramics are relatively low. Ceramic compositions containing less than 0.05 weight % manganese (as $MnO_2$) exhibited low $Q_M$. The compositions containing more than 3 weight % of $Nb_2O_5$ additive, more than 2 weight % of $WO_3$ or more than 3 weight % of $Sb_2O_3$ exhibit relatively low tensile strength. The ceramic compositions containing less than 0.3 weight % of $Nb_2O_5$ additive, less than 0.1 weight % of $WO_3$ or less than 0.1 weight % of $Sb_2O_3$ exhibit also relatively low tensile strength. For these reasons, the compositions outside these ranges are excluded from the scope of this invention.

In addition to the superior properties shown above, the compositions according to this invention yield ceramics of good physical quality and which polarize well. It will be understood from the foregoing that the quaternary solid solution $Pb(Zn_{1/3}Nb_{2/3})O_3$-$Pb(Sn_{1/3}Nb_{2/3})O_3$-$PbTiO_3$-$PbZrO_3$ modified with the specified amounts of $MnO_2$ and $Nb_2O_5$, $WO_3$ or $Sb_2O_3$ as additives form excellent piezoelectric ceramics.

It will be evident that the starting materials to be used in this invention are not limited to those used in the above examples. Those oxides may be used, in place of the starting materials of the above examples, which are easily decomposed at elevated temperatures to form the required compositions.

While there have been described what at present are believed to be the preferred embodiments of this invention, it will be obvious that the various changes and modifications can be made therein without departing from the spirit or scope of this invention.

Table 1

| Ex. No. | Basic Compositions | Weight % of $MnO_2$ Additive | Weight % of $Nb_2O_5$ Additive | Weight % of $WO_3$ Additive | Weight % of $Sb_2O_3$ Additive | Planar Coupling Coefficient $K_p$ | Mechanical Quality Factor $Q_M$ | Tensile Strength (kg/cm$^2$) |
|---|---|---|---|---|---|---|---|---|
| 1 | $Pb(Zn_{1/3}Nb_{2/3})_{0.03}(Sn_{1/3}Nb_{2/3})_{0.06}Ti_{0.45}Zr_{0.46}O_3$ | 1.0 | — | — | — | 0.60 | 2100 | 260 |
| 2 | Same as above | 1.0 | 0.5 | — | — | 0.62 | 2400 | 350 |
| 3 | " | 1.0 | 1.0 | — | — | 0.61 | 2300 | 460 |
| 4 | " | 1.0 | — | 0.5 | — | 0.61 | 2700 | 340 |
| 5 | " | 1.0 | — | 1.0 | — | 0.61 | 2400 | 350 |
| 6 | " | 1.0 | — | — | 0.5 | 0.61 | 2500 | 390 |
| 7 | " | 1.0 | — | — | 1.0 | 0.61 | 2600 | 410 |
| 8 | $Pb(Zn_{1/3}Nb_{2/3})_{0.09}(Sn_{1/3}Nb_{2/3})_{0.09}Ti_{0.42}Zr_{0.40}O_3$ | 0.5 | — | — | — | 0.62 | 2100 | 280 |
| 9 | Same as above | 0.5 | 0.3 | — | — | 0.63 | 2300 | 320 |
| 10 | " | 0.5 | 0.5 | — | — | 0.64 | 2600 | 360 |
| 11 | " | 0.5 | 1.0 | — | — | 0.64 | 2600 | 440 |
| 12 | " | 0.5 | 2.0 | — | — | 0.64 | 2300 | 490 |
| 13 | " | 0.5 | 3.0 | — | — | 0.62 | 2300 | 350 |
| 14 | " | 0.5 | — | 0.1 | — | 0.63 | 2300 | 300 |
| 15 | " | 0.5 | — | 0.5 | — | 0.64 | 2600 | 390 |
| 16 | " | 0.5 | — | 1.0 | — | 0.64 | 2800 | 370 |
| 17 | " | 0.5 | — | 1.5 | — | 0.63 | 2500 | 370 |
| 18 | " | 0.5 | — | 2.0 | — | 0.63 | 2500 | 330 |
| 19 | " | 0.5 | — | — | 0.1 | 0.63 | 2200 | 300 |
| 20 | " | 0.5 | — | — | 0.5 | 0.64 | 2500 | 420 |

Table 1-continued

| Ex. No. | Basic Compositions | Compositions Weight % of $MnO_2$ Additive | Weight % of $Nb_2O_5$ Additive | Weight % of $WO_3$ Additive | Weight % of $Sb_2O_3$ Additive | Planar Coupling Coefficient $K_p$ | Mechanical Quality Factor $Q_M$ | Tensile Strength (kg/cm²) |
|---|---|---|---|---|---|---|---|---|
| 21 | " | 0.5 | — | — | 1.0 | 0.64 | 2700 | 490 |
| 22 | " | 0.5 | — | — | 2.0 | 0.64 | 2300 | 450 |
| 23 | " | 0.5 | — | — | 3.0 | 0.63 | 2300 | 330 |

What is claimed is:

1. A piezoelectric ceramic composition consisting essentially of a solid solution of a material represented by the formula:

$$Pb(Zn_{1/3}Nb_{2/3})_A(Sn_{1/3}Nb_{2/3})_B Ti_C Zr_D O_3$$

wherein the ranges for A, B, C and D are $0.01 \leq A \leq 0.50$, $0.01 \leq B \leq 0.25$, $0.25 \leq C \leq 0.625$ and $0.20 \leq D \leq 0.625$, and wherein $A+B+C+D=1$, and further containing 0.05 to 5 weight percent of manganese dioxide ($MnO_2$) and 0.3 to 3 weight percent of niobium oxide ($Nb_2O_5$).

2. A piezoelectric ceramic material consisting essentially of a solid solution represented by the formula:

$$Pb(Zn_{1/3}Nb_{2/3})_{0.09}(Sn_{1/3}Nb_{2/3})_{0.09}Ti_{0.42}Zr_{0.40}O_3$$

and further containing 0.5 weight percent of manganese dioxide ($MnO_2$) and 2 weight percent of niobium oxide ($Nb_2O_5$).

* * * * *